United States Patent

Xu et al.

(10) Patent No.: US 8,891,577 B2
(45) Date of Patent: Nov. 18, 2014

(54) SYSTEM AND METHOD FOR A MICRO RING LASER

(75) Inventors: Qianfan Xu, Mountain View, CA (US); Marco Fiorentino, Mountain View, CA (US); Raymond G. Beausoleil, Redmond, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 62 days.

(21) Appl. No.: 12/990,940

(22) PCT Filed: May 6, 2008

(86) PCT No.: PCT/US2008/062791
§ 371 (c)(1), (2), (4) Date: Nov. 3, 2010

(87) PCT Pub. No.: WO2009/136913
PCT Pub. Date: Nov. 12, 2009

(65) Prior Publication Data
US 2011/0064106 A1    Mar. 17, 2011

(51) Int. Cl.
*H01S 3/083* (2006.01)
*H01S 5/10* (2006.01)
*H01S 5/042* (2006.01)
*H01S 5/02* (2006.01)

(52) U.S. Cl.
CPC ........... *H01S 5/1071* (2013.01); *H01S 5/101* (2013.01); *H01S 5/0425* (2013.01); *H01S 5/021* (2013.01); *H01S 2301/173* (2013.01); *H01S 5/1032* (2013.01)
USPC .............................................. 372/94; 372/87

(58) Field of Classification Search
CPC ....... H01S 5/1071; H01S 5/1075; H01S 5/22; H01S 5/2201
USPC .................................................. 372/93, 94, 87
See application file for complete search history.

(56) References Cited

U.S. PATENT DOCUMENTS

| | | | |
|---|---|---|---|
| 5,652,556 | A | 7/1997 | Flory et al. |
| 5,825,799 | A | 10/1998 | Ho et al. |

(Continued)

FOREIGN PATENT DOCUMENTS

| | | |
|---|---|---|
| JP | 1999-507471 | 6/1999 |
| JP | 2006-278770 | 10/2006 |

(Continued)

OTHER PUBLICATIONS

Fang et al., "Electrically Pumped Hybrid AlGaInAs-Silicon Evanescent Laser", Oct. 2, 2006, Optics Express, vol. 14, No. 20, 9203-9210.*

(Continued)

*Primary Examiner* — Colleen A Matthews
*Assistant Examiner* — Joshua King

(57) ABSTRACT

A system and method for an electrically pumped laser system is disclosed. The system includes a silicon micro-ring resonator 405. A quantum well 412 formed of a III-V group semiconductor material is optically coupled with the micro-ring resonator 405 to provide optical gain. A trapezoidal shaped buffer 414 formed of a III-V group semiconductor material and doped with a first type of carrier is optically coupled to the quantum well 412. A ring electrode 410 is coupled to the trapezoidal shaped buffer 414. The trapezoidal shaped buffer 414 enables the ring electrode 410 to be substantially isolated from an optical mode of the micro-ring resonator 405.

13 Claims, 6 Drawing Sheets

(56) References Cited

U.S. PATENT DOCUMENTS

| | | | |
|---|---|---|---|
| 5,878,070 A * | 3/1999 | Ho et al. | 372/92 |
| 6,044,098 A * | 3/2000 | Sun | 372/46.013 |
| 6,052,495 A | 4/2000 | Little et al. | |
| 6,282,226 B1 * | 8/2001 | Furukawa | 372/94 |
| 6,839,488 B2 * | 1/2005 | Gunn, III | 385/40 |
| 7,106,448 B1 | 9/2006 | Vawter et al. | |
| 7,242,705 B2 | 7/2007 | Kneissl et al. | |
| 7,257,283 B1 | 8/2007 | Liu et al. | |
| 2004/0114930 A1 | 6/2004 | Krug et al. | |
| 2006/0180762 A1 | 8/2006 | Kolodzey et al. | |
| 2006/0222039 A1 | 10/2006 | Yamazaki | |
| 2007/0051963 A1 | 3/2007 | Chen | |
| 2007/0170417 A1 * | 7/2007 | Bowers | 257/14 |
| 2007/0228552 A1 | 10/2007 | Takeuchi et al. | |
| 2007/0258495 A1 | 11/2007 | Hamamoto et al. | |
| 2009/0016399 A1 * | 1/2009 | Bowers | 372/50.21 |

FOREIGN PATENT DOCUMENTS

| | | |
|---|---|---|
| JP | 2007-266260 | 10/2007 |
| JP | 2009-537871 | 10/2009 |

OTHER PUBLICATIONS

Van Campenhout et al., "Electrically Pumped InP-Based Microdisk Lasers Integrated with a Nanophotonic Silicon-on-Insulator Waveguide Circuit", May 28, 2007, Optics Express, vol. 15, No. 11, 6744-6749.*

Xu et al., "Micrometre-Scale Silicon Electro-optic Modulator," May 19, 2005, Nature, 435, 325-327.*

Alexander W. Fang, Electrically pumped hybrid AlGaInAs-silicon evanescent laser, Oct. 2, 2006, vol. 14, No. 20/Optics Express 9203.

Alexander W. Fang, Integrated AlGaInAs-silicon evanescent racetrack laser and photodetector, Mar. 5, 2007, vol. 15, No. 5/Optics Express 2315.

C. Seassal, InP microcisk lasers on silicon wafer: CW room temperature operation at 1.6um, Feb. 15, 2001, Electronics Letters vol. 37 No. 4.

H. T. Hattori, Heterogeneous Integration of Microdisk Lasers on Silicon Strip Waveguids for Optical Interconnects, IEEE Photonics Technology Letters, vol. 18, No. 1, Jan. 1, 2006.

Hsu-Hao Chang, 1310nm silicon evanescent laser, Sep. 3, 2007, vol. 15, No. 18/Optics Express 11466.

Hyndai Park, Hybrid silicon evanescent laser fabricated with a silicon waveguide and III-V offset quantum wells, Nov. 14, 2005, vol. 13, No. 23/Optics Express 9460.

International Search Report, dated May 14, 2009; PCT Application No. PCT/US2008/062791, filed May 6, 2008.

J. Van Campenhout, Electrically Injected InGaAsP Microdisk Lasers Heterogeneously Integrated on a Si-wafer, Ghent University-IMEC, Department of Information Technology, Mar. 2006.

M. Fujita, Continuous wave lasing in GaInAsP microdisk injection laser with threshold current of 40uA, Apr. 27, 2000, Electronics Letters vol. 36 No. 9.

P. Fojo Romeo, InP on Silicon Electrically Driven Microdisk Lasers for Photonic IC's, Laboratorie d'Electronique, Ecole Centrale de Lyon, Jan. 2006.

Seung June Choi, Microdisk Lasers Vertically Coupled to Output Waveguides, IEEE Photonics Technology Letters, vol. 15, No. 10, Oct. 2003.

* cited by examiner

US 8,891,577 B2

SYSTEM AND METHOD FOR A MICRO RING LASER

BACKGROUND

As computing power and data storage capacities have exponentially increased over the last several decades, a corresponding amount of stored data has also exponentially increased. Computers which were once the domain of text files and a few low resolution pictures are now often used to store thousands of high resolution pictures and hours of video. Television sets are being upgraded to show high definition video. New generations of optical discs have been developed to hold the high definition video. The discs can hold as much as 50 gigabytes of data on each side. This is enough to store several hours of video in a high definition format. Ever denser storage formats are being developed to store the increasing amounts of information.

Moving and transmitting the vast amounts of digital information is becoming more challenging. Each year, more electronic devices are available that can digitally communicate with other devices. Electronics including computers, high definition television, high definition radio, digital music players, portable computers, and many other types of devices have been designed to transmit and receive large amounts of information. Many computers now receive broadband internet which is broadcast throughout the home. Televisions are receiving multiple high definition signals from cable and fiber optics.

In order to transmit the immense quantities of data stored in computers and broadcast to televisions and other electronics devices, the data is transmitted at ever faster rates. However, transmission rates are not keeping up with the explosion in data. For example, to transmit a typical 15 gigabyte high definition movie from an optical disk to a home entertainment system, it requires 100 megabits to be transmitted per second for twenty minutes. For many users, taking 20 minutes to transfer a movie can be burdensome.

Similarly, higher bandwidth communication between processors, memory, other chips, and computer boards within a computer system is needed. One way to decrease the amount of time it takes to move large amounts of digital information between computer chips is to transmit the information at faster speeds. Transmission speeds that can move large volumes of data in a reasonable time, however, have historically been too costly to be broadly used in consumer electronics.

DETAILED DESCRIPTION OF EXAMPLE EMBODIMENTS

Optoelectronic integration on silicon is a technology used to build optical interconnection systems and other large-scale photonic systems on a chip. Integrated photonic systems typically use a lower cost and easy-to-integrate electrically pumped laser source. Silicon, however, is limited by its fundamental material properties and therefore cannot efficiently provide the electrically pumped optical gain used in laser operation. Therefore, hybrid integration of gain material, such as III-V group semiconductors located on a silicon platform, can be used to construct an on-chip electrically pumped laser.

In order for the integrated electrically pumped laser source to be marketable, the process of integrating the III-V group gain material onto the silicon needs to be relatively low cost and easy to implement. In one embodiment, the present invention provides a system and method for making a micro-ring resonator that can be used as a relatively small on-chip laser source that can be directly modulated at speeds greater than one gigahertz. An electrically pumped laser source using a ring modulator can be used to send information across a chip and then off-chip to waveguides and neighboring electronic devices. The electrically pumped laser source using a ring modulator can be implemented relatively inexpensively since it relies on wafer-bonding that does not require critical alignment in the bonding step, as is typically needed in chip-bonding.

Figure 1:
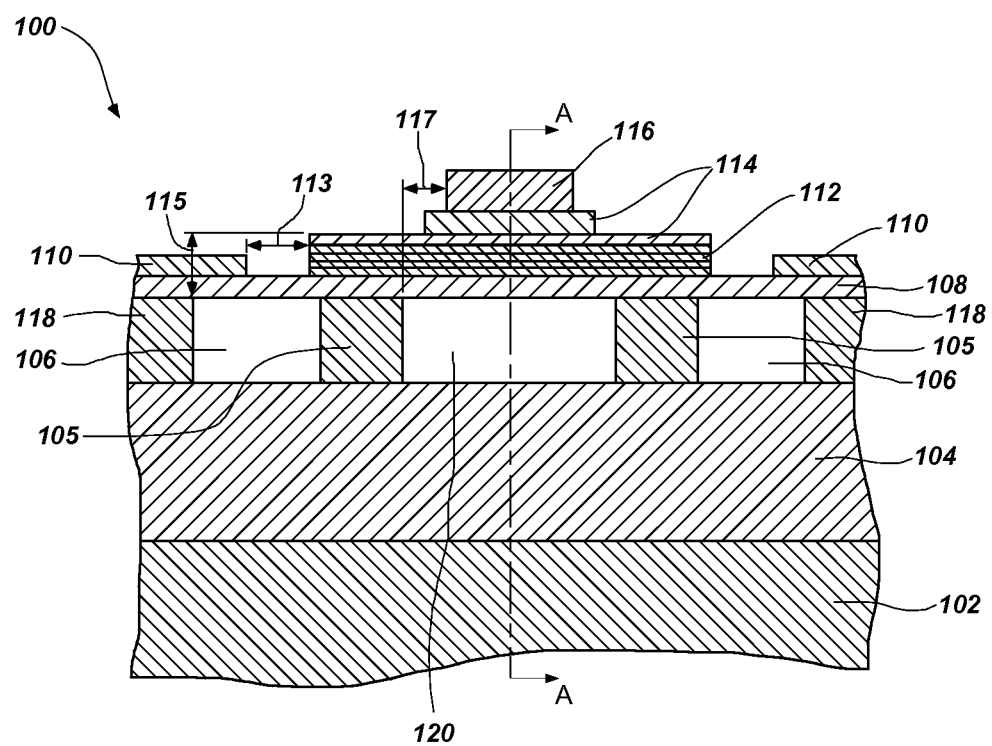
FIG. 1 illustrates a cross sectional view of a hybrid III-V-silicon micro-ring electrically pumped laser system in accordance with an embodiment of the present invention.

FIG. 1 illustrates a cross sectional view of a hybrid III-V-silicon micro-ring electrically pumped laser system 100. In this example, a silicon substrate 102 is illustrated to support the laser system. Other types of substrates that are used in semiconductor manufacturing processes are considered to be within the scope of the present invention. An under-cladding 104 can be formed on the silicon substrate. A silicon micro-ring resonator 105 can be constructed on the surface of the under-cladding. The under-cladding is used to substantially constrain light within the silicon micro-ring resonator.

The under-cladding can be constructed of a material that has an index of refraction that is less than the index of refraction of the silicon micro-ring resonator and is substantially transparent at the wavelength of light injected in the resonator. For example, the under-cladding may be formed using silicon dioxide. Alternatively, the under-cladding may be formed of a material such as silicon nitride or another material meeting the above requirements. The area within 120 and outside of 106 the micro-ring resonator can also be formed of a material that has an index of refraction that is less than the refractive index of the resonator and is substantially transparent at the wavelength of light injected in the resonator. In one embodiment, the area within and outside of the micro-ring resonator can be formed of air or a vacuum. Alternatively, another substance such as silicon dioxide or silicon nitride may be used.

The silicon micro-ring resonator 105 can have a radius that is roughly proportional to or slightly smaller than a wavelength of the light that is carried by the micro-ring resonator. Alternatively, the radius of the silicon micro-ring resonator can be greater than the wavelength of the light. For example, the wavelength of the light may be 1.54 micrometers and the radius of the micro-ring resonator configured to carry the light can be about 3 micrometers. Typical dimensions for the silicon micro-ring resonator can vary from 2.5 microns to tens of microns depending on the wavelength of the light and other design considerations. Other wavelengths of light can also be used, such as the 1.31 micron wavelength commonly used in telecommunications. The silicon micro-ring resonator can be designed to carry wavelengths of light ranging from the deep infrared to ultraviolet light.

A PN junction can be constructed across a quantum well 112 that is optically coupled with the micro-ring resonator 105. A quantum well is a potential well that confines carriers, which were originally free to move in three dimensions, to two dimensions, forcing them to occupy a planar region. Because of their quasi-two dimensional nature, electrons in quantum wells have a sharper density of states than bulk materials. The quantum well structure is used to alter the density of states of the semiconductor, and results in an improved semiconductor laser requiring fewer carriers (electrons and holes) to reach laser threshold than other types of structures such as a conventional double heterostructure. The quantum well can be comprised of a III-V group material such as such as indium phosphide, indium gallium arsenide phosphide, and the like. A single or multiple quantum well may be used in the disclosed embodiments, as can be appreciated. The quantum well 112 can be wafer bonded to a buffer layer 108. Wafer bonding the quantum well to the buffer layer can provide for lower tolerances in manufacturing the device, as previously discussed.

The PN junction formed by the two contacts 108, 114 can also be comprised of a III-V group material, with the material being doped with a carrier. In one embodiment, an n-doped contact 108 can be directly placed on the silicon micro-ring resonator 105. Supports 118 can be used to carry the n-doped contact. The quantum well 112 can be placed on the n-doped contact and aligned collinearly with the micro-ring resonator to enable the quantum well to be optically coupled with the micro-ring resonator. A p-doped contact 114 can be placed on the opposite side of the quantum well from the n-doped contact to form a PN junction. In one embodiment, the quantum well can be considered an intrinsic layer. The p-contact, the n-contact, and the quantum well can then be considered a PIN junction.

Electrodes 116 and 110 can be positioned as illustrated in FIG. 1 to forward bias the PN junction to provide carriers within the quantum well 112. In one embodiment, the electrodes can be formed of a metallic material. Alternatively, a substantially conductive, non-metallic material or a composite may be used to inject current into the quantum well. The center electrode 116 can be coupled to the p-contact 114 and positioned coaxial with the quantum well and micro-ring resonator 105. A distance 117 between the outer edge of the center electrode and the inner edge of the micro-ring resonator may be approximately 0.3 to 1.0 micrometers. An outer electrode 110 can be located outside the micro-ring resonator. The outer electrode can be separated by a distance 113 of 0.5 to 1.0 micrometers from the quantum well. The combined thickness 115 of the n-contact 108, the quantum well 112, and the p-contact may be approximately 0.2 to 0.4 microns. The electrodes can be used to forward bias the PN junction and inject current into the quantum well. Obviously, the n and p doped contacts can be switched and the bias reversed to achieve the same result.

In prior electrically pumped diode lasers, the electrodes that contact the semiconductor material have high optical losses. Therefore, the electrodes are usually isolated from the optical mode of the resonator. This means that the electrodes have to be placed several micrometers away from the center of the optical resonator. In the electrically pumped laser system 100 illustrated in FIG. 1, the quantum well 112 gain medium is bonded on top of the silicon-based micro-ring resonator 105.

Mode isolation from a top electrode typically uses a relatively thick buffer layer between the quantum well and the center electrode. This buffer layer has a refractive index close to that of silicon. The presence of this thick buffer layer can severely limit the ability to confine light in a micro-ring resonator since the optical mode will spread into this buffer layer instead of following the tightly bent path of the micro-ring resonator. Previous attempts to overcome this problem have included constructing a ring resonator with a perimeter of over 2 millimeters. A ring resonator of this size is quite large to be integrated in a microchip. Additionally, a large ring resonator typically cannot be modulated at a sufficiently high speed needed for on and off-chip communications.

The structure illustrated in FIG. 1 enables the center electrode 116 to be isolated from the quantum well 112 by displacing the electrodes in the horizontal direction. One of the contact electrodes (the p-electrode 116 in FIG. 1) is placed inside the silicon ring. The other electrode is placed outside the ring, as previously discussed. Both of the electrodes are located at a distance of approximately 0.3 to 1.0 micrometers from the silicon ring 105 where the optical mode is guided. This allows a relatively thin layer of III-V group material to be located on top of the silicon ring to overlap with the optical mode and to provide the optical gain necessary to achieve lasing. This thin gain layer does not significantly affect the ability of the optical mode to bend and remain confined within micro-ring cavities. Modeling and simulation has shown that the micro-ring resonator with the structure illustrated in FIG. 1 can have a radius of 2.5 micrometers or less.

Figure 2:
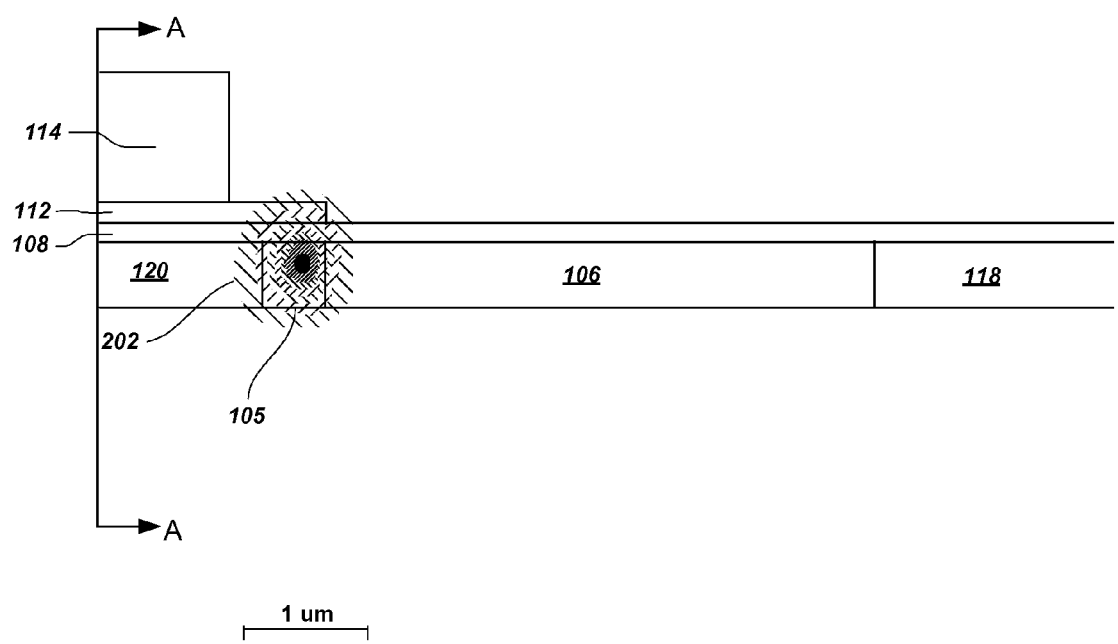
FIG. 2 illustrates a cross sectional view of a simulated optical mode using the structure illustrated in FIG. 1 in accordance with an embodiment of the present invention.

FIG. 2 illustrates a cross sectional view of a simulated optical mode using the structure illustrated in FIG. 1. A first side of the silicon micro-ring resonator 105 is shown with the optical mode 202 being carried substantially within the silicon micro-ring resonator. The actual size of the optical mode depends on the type of mode that is supported by the micro-ring resonator and the wavelength of the light within the resonator. A portion of the optical mode can extend through the n-contact 108 and into the quantum well 112. As previously discussed, the quantum well may be a single or multiple quantum well configuration. The portion of the optical mode that extends into the quantum well can be amplified as the PN junction is forward biased to direct current to flow into the quantum well and electrically pump the portion of the optical mode that couples to the quantum well. The light within the quantum well is amplified and returned to the resonator. The optical mode may be evanescently coupled to the quantum well.

Figure 3:
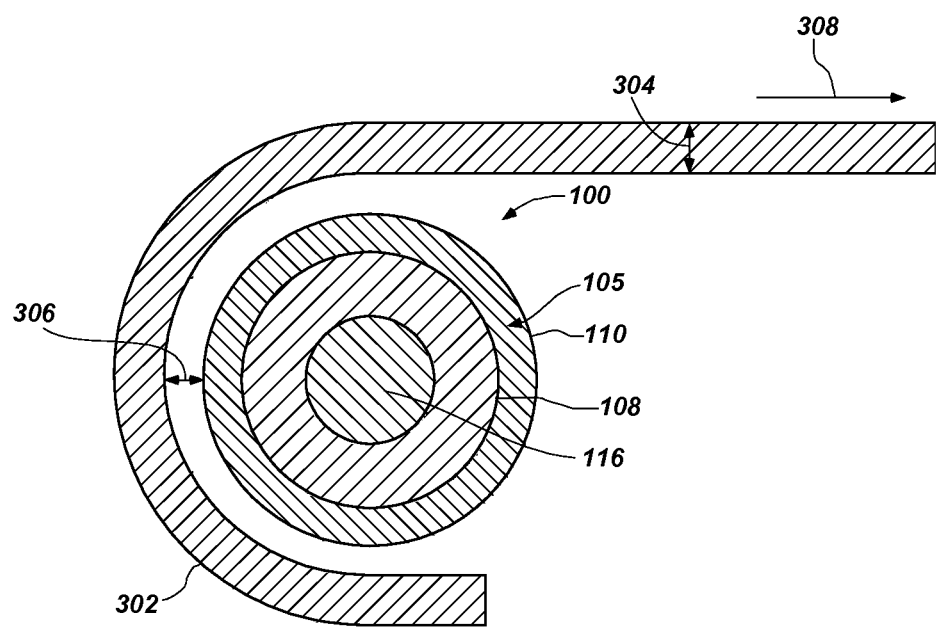
FIG. 3 illustrates a top view of a micro-ring electrically pumped laser system evanescently coupled with an optical waveguide in accordance with an embodiment of the present invention.

FIG. 3 illustrates a top view of the hybrid III-V-silicon micro-ring electrically pumped laser system 100. The center electrode 116 is shown at the center of the micro-ring resonator 105. A portion of the n-contact 108 is shown between the center electrode 116 and the outer electrode 110. An optical waveguide 302 can be located near the laser system to allow the amplified light within the micro-ring resonant to evanescently couple into the waveguide. In one embodiment, a wrap around waveguide can be used to increase the amount of light that evanescently couples into the waveguide from the laser system. The waveguide may be placed at a distance 306 of less than one third of the wavelength of the light. In one embodiment, the waveguide may be placed at a distance of 0.200 micrometers (200 nanometers) from the micro-ring resonator 105. The width 304 of the waveguide can be on the order of 0.450 to 0.500 micrometers. The waveguide can be used to carry light away 308 from the laser resonator to other portions of an integrated circuit or to nearby chips or other components on a circuit board.

The structure of the hybrid III-V-silicon micro-ring electrically pumped laser system 100 provides several advantages over previous hybrid laser systems. First, the compact size of the laser enables large-scale integration of a large number of the laser-on-chip systems without occupying significant space on the chip. Second, the silicon micro-ring resonator 105 can be fabricated using industry-standard CMOS-compatible techniques. Third, the small volume of the micro-ring resonator allows for low-power, high-speed (>1 GHz) direct modulation of the laser by applying a modulated signal to the PN junction surrounding the quantum well. This allows data to be inexpensively transmitted at relatively high rates, thereby reducing or eliminating bandwidth bottlenecks that occur in integrated electrical systems. Fourth, the micro-ring resonator 105 provides much larger longitudinal-mode spacing than other hybrid silicon laser configurations such as the racetrack configuration. The longitudinal mode spacing is inversely proportional to the micro-ring resonator length. The larger mode spacing can enable single longitude-mode lasing, thereby resulting in a much higher quality of the laser light output from the micro-ring resonator.

Figure 4:
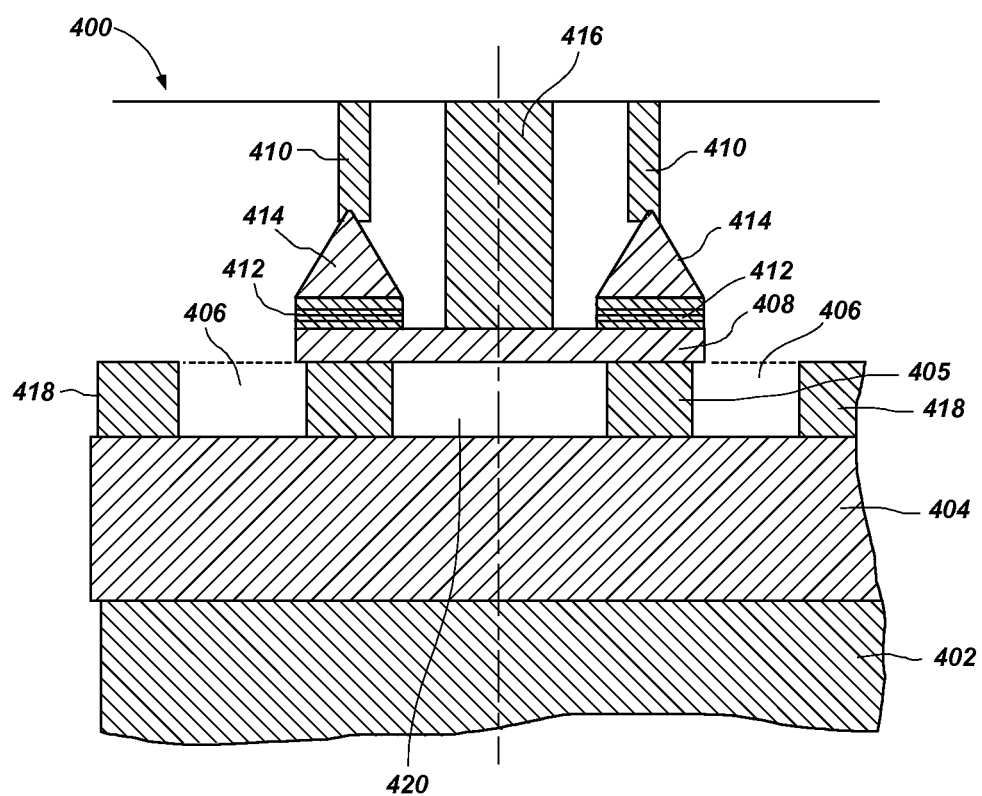
FIG. 4 illustrates a cross sectional view of a micro-ring electrically pumped laser system having a trapezoidal shaped buffer in accordance with an embodiment of the present invention.

In another embodiment, an additional structure for a hybrid III-V-silicon micro-ring electrically pumped laser system 400 is illustrated in FIG. 4. The embodiment illustrated in the cross-sectional illustration of FIG. 4 includes a substrate 402 coupled to an under-cladding 404 that is optically coupled to a silicon micro-ring resonator 405. The under-cladding layer is formed of a material having an index of refraction that is less than the index of refraction of the silicon micro-ring resonator and that is substantially optically transparent at a wavelength of laser light within the micro-ring resonator. An inside gap 420 and outside gap 406 is shown relative to the resonator. The inside and outside gaps can be formed of a material having an index of refraction that is less than the index of refraction of the silicon micro-ring resonator and that is substantially optically transparent at a wavelength of laser light within the resonant cavity, such as air, vacuum, silicon dioxide, silicon nitride, and the like.

A trapezoidal shaped buffer 414 formed of a III-V group semiconductor material and doped with a first type of carrier is shown. The carrier may be either an n-type carrier or a p-type carrier. The trapezoidal shaped buffer 414 is optically coupled to the quantum well 412. A second buffer 408 formed of III-V group semiconductor material and doped with a second carrier having a charge opposite the first carrier is located between a quantum well 412 and the silicon micro-ring resonator 405. The second buffer has a sufficient length to interface with both sides of the silicon micro-ring resonator.

The trapezoidal shaped buffer 414 and the second buffer 408 are configured to form a PN junction, with the quantum well 412 located between the trapezoidal shaped buffer and the second buffer. The PN junction supplies carriers to be injected into the quantum well to provide optical gain to light within the silicon micro-ring resonator 405.

A ring electrode 410 is electrically coupled to a narrow end of the trapezoidal shaped buffer 414. The ring electrode may be formed of metal or another highly conductive material or composite. The wide end of the trapezoidal shaped buffer is in direct contact with the quantum well 412. The quantum well, the trapezoidal shaped buffer, and the ring electrode all form a ring above the silicon micro-ring resonator 405. A center electrode 416 is placed near a center of the micro-ring resonator and contacts the second buffer 408 located on top of the resonator. The location of the center electrode allows carriers to be injected into the quantum well by applying a bias potential between the center electrode and the ring electrode.

The trapezoidal shaped buffer 414 can have a trapezoidal or triangular shape. The buffer can be formed using, for example, a weakly anisotropic etching process. In one embodiment, the buffer may be etched to form a plurality of levels, with each increasing level having a decreasing length to form a pyramidal shaped buffer.

Figure 5:
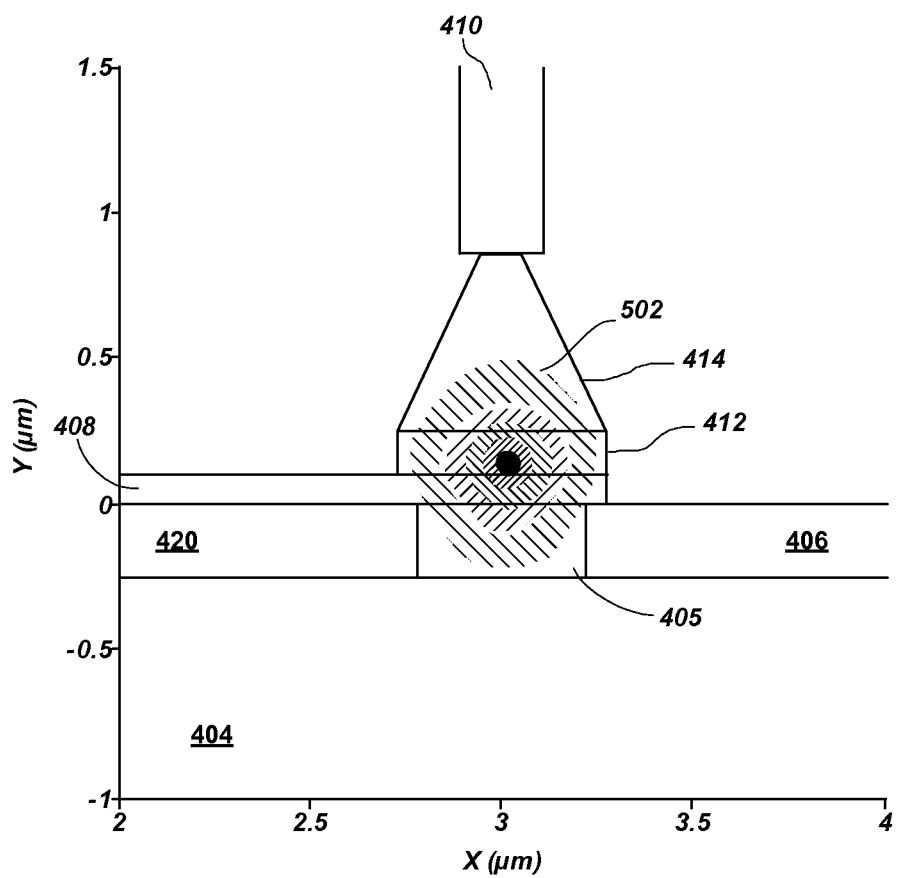
FIG. 5 illustrates a cross sectional view of a simulated optical mode using the structure illustrated in FIG. 4 in accordance with an embodiment of the present invention.

FIG. 5 illustrates a cross sectional view of a simulated optical mode using the structure illustrated in FIG. 4. One side of the silicon micro-ring resonator 405 is shown with a portion of the optical mode 502 being carried within the silicon micro-ring resonator. The actual size of the optical mode depends on the type of mode that is supported by the micro-ring resonator and the wavelength of the light within the resonator. A portion of the optical mode can extend through the n-contact 408, into the quantum well 412, and into the trapezoidal shaped buffer 414. It should be noted that the trapezoidal shaped buffer can be created using a plurality of etched steps to form a pyramidal shaped buffer.

As illustrated in FIG. 5, the system shown in FIG. 4 provides a significant improvement over the system shown in FIG. 1 in the amount of the optical mode 502 that is located within the quantum well 412. The thickness of the micro-ring resonator 405, second buffer 408, and the quantum well 412, along with the height and shape of the trapezoidal shaped buffer 414 can enable the area of the optical mode that has the greatest amount of electromagnetic energy to be positioned within the quantum well. Constructing the system such that the highest density of the optical mode is located within the quantum well provides a significant improvement in the efficiency of the laser. The confinement factor of the fundamental mode in the quantum well is approximately 35%, significantly higher than other types of III-V group-silicon hybrid laser systems. The shape of the structure illustrated in FIG. 5 enables the optical mode to directly couple with the quantum well 412 and the trapezoidal shaped buffer 414. The direct optical coupling provides an optical mode with substantially higher power than can be achieved through evanescent coupling between the silicon micro-ring resonator 405 and the quantum well.

The shape of the trapezoidal buffer 414 can be selected to maximize the confinement factor of the optical mode. A trapezoidal shaped buffer with a narrower top will move the fundamental mode downward. Conversely, a trapezoidal shaped buffer with a wider top will allow the fundamental mode to be positioned higher within the trapezoidal buffer. Additionally, the structure illustrated in FIG. 5 provides only a single low-loss mode, the fundamental transverse-electric mode (TE mode). Because of the shape of the trapezoidal buffer, a significantly reduced amount of light is lost at the buffer-electrode transition. Testing has shown that loss with an aluminum center electrode 410 is approximately 0.4 dB/cm.

The TE polarization has high optical gain from the quantum well. The transverse-magnetic (TM) mode and higher order modes have losses that are two orders of magnitude higher than the fundamental TE-mode. Therefore, only the fundamental TE-mode will lase. Substantially all of the quantum well area has effective interaction with the optical mode. Therefore, a substantial amount of the pump current injected into the quantum well is used to stimulate photons, thereby resulting in a substantially high pump efficiency. The confinement factor of the optical mode 502 within the quantum well 412 can be greater than 35 percent. More typical levels of confinement can vary from 20 percent to approaching 40 percent. Stimulated light from the silicon micro-ring resonator illustrated in FIGS. 4 and 5 can be coupled to a waveguide through evanescent coupling, as previously discussed and shown in FIG. 3.

Figure 6:
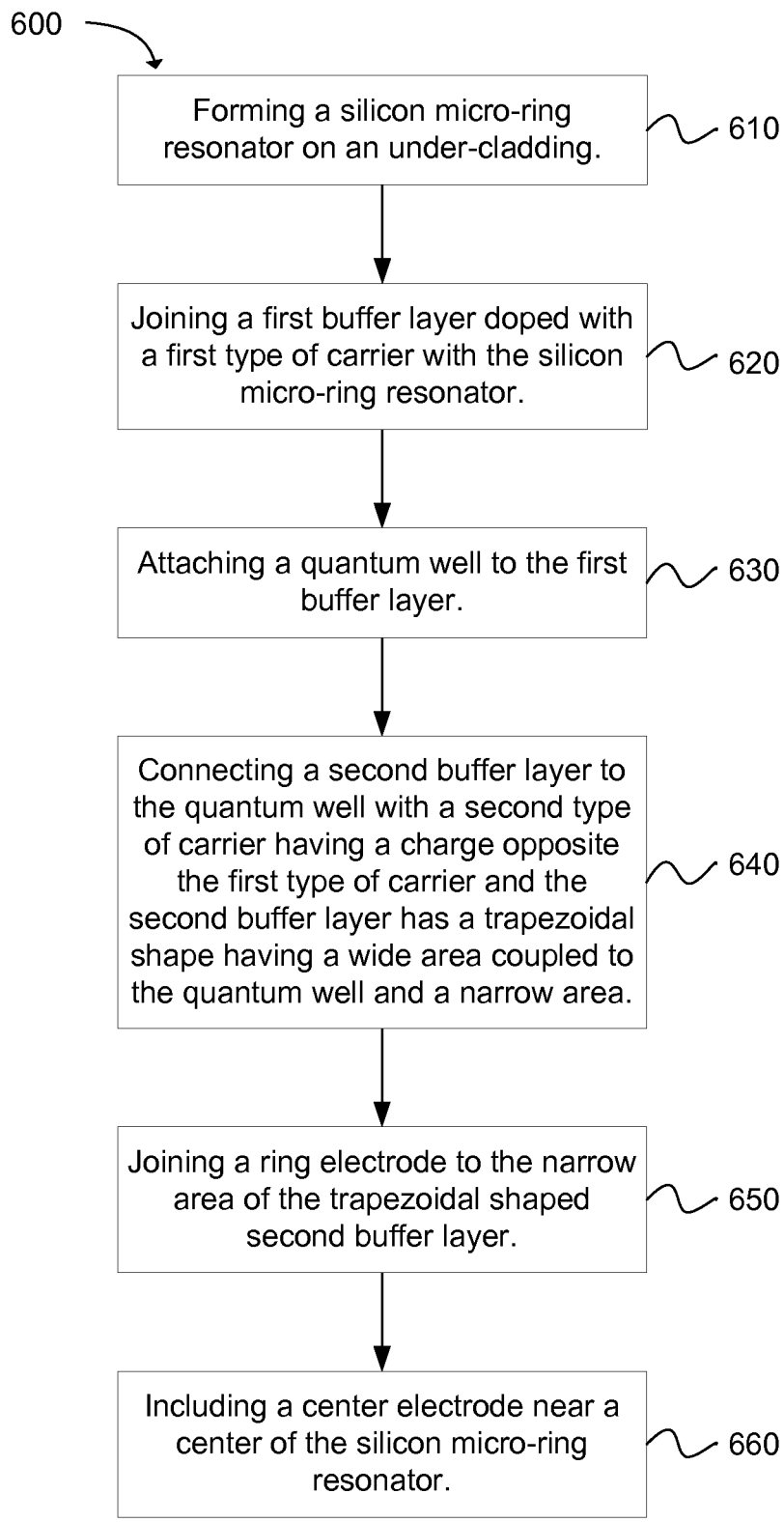
FIG. 6 illustrates a flow chart depicting a method for forming an electrically pumped laser for stimulating light of a selected wavelength in accordance with an embodiment of the present invention.

In another embodiment, a method 600 for forming an electrically pumped laser for stimulating light of a selected wavelength is disclosed, as shown in FIG. 6. The method includes the operation of forming 610 a silicon micro-ring resonator on an under-cladding having an index of refraction that is less than an index of refraction of the silicon micro-ring resonator. The method further includes the operation of joining 620 a first buffer layer with the silicon micro-ring resonator. The first buffer layer is formed of a III-V group semiconductor material doped with a first type of carrier. An additional operation involves attaching 630 a quantum well to the first buffer layer, with the quantum well being optically coupled to the silicon micro-ring resonator.

The method 600 further involves connecting 640 a second buffer layer to the quantum well. The second buffer layer can be formed of III-V group semiconductor material doped with a second type of carrier having a charge opposite the first type of carrier. The second buffer layer can have a trapezoidal shape having a wide area coupled to the quantum well and a narrow area opposite the wide area. The method further includes joining 650 a ring electrode to the narrow area of the trapezoidal shaped second buffer layer. An additional operation provides for including 660 a center electrode about a center of the silicon micro-ring resonator to enable carriers to be injected into the quantum well between the center electrode and the ring electrode to provide amplification of the light of the selected wavelength.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:
1. An electrically pumped hybrid III-V group and silicon laser system, comprising:
    a silicon micro-ring resonator;
    a quantum well formed of a III-V group semiconductor material that is optically coupled with the silicon micro-ring resonator to provide optical gain;
    a first buffer formed of a III-V group semiconductor material doped with a first type of carrier, wherein the first buffer is optically coupled to the quantum well and the first buffer forms a ring with a cross section that is substantially triangular shaped or substantially trapezoidal shaped, wherein a trapezoidal shaped cross section comprises a quadrilateral with two parallel sides and two non-parallel sides;
    a ring electrode coupled to the first buffer, wherein the first buffer enables the ring electrode to be substantially isolated from an optical mode of the micro-ring resonator, wherein the ring electrode contacts the first buffer continuously around an edge of the ring formed by the first buffer;
    a second buffer formed of III-V group semiconductor material doped with a second type of carrier having a charge opposite the first type of carrier, the second buffer being located between the quantum well and the silicon micro-ring resonator; and
    a center electrode that contacts the second buffer to allow carriers to be injected into the quantum well by applying a bias potential between the center electrode and the ring electrode;
    wherein an imaginary cylinder has a center positioned at the center of the silicon micro-ring resonator and the imaginary cylinder has a radius defined by an innermost edge of the silicon micro-ring resonator, wherein the center electrode is confined within the imaginary cylinder.

2. The system of claim 1, wherein a height of the silicon micro-ring resonator, the second buffer, the quantum well, and the first buffer is selected to enable a single fundamental transverse-electric (TE) mode of laser light to propagate within the resonator, with a maximum amount of electromagnetic energy in the TE-mode located within the quantum well to provide increased amplification of laser light within the quantum well.

3. The system of claim 1, wherein the first buffer is comprised of a plurality of levels, with each increasing level having a decreasing length.

4. The system of claim 3, wherein the first buffer is formed by etching a plurality of steps to form the plurality of levels.

5. The system of claim 1, further comprising an under-cladding layer located below the silicon micro-ring resonator, wherein the under-cladding layer is formed of a material having an index of refraction that is less than the index of refraction of the silicon micro-ring resonator and that is substantially optically transparent at a wavelength of laser light within the micro-ring resonator.

6. The system of claim 1, further comprising an optical waveguide located sufficiently close to the silicon micro-ring resonator to enable laser light from the micro-ring resonator to couple evanescently to the optical waveguide.

7. A method for forming an electrically pumped hybrid III-V group and silicon laser for stimulating light of a selected wavelength, comprising:
    forming a silicon micro-ring resonator on an under-cladding having an index of refraction that is less than an index of refraction of the silicon micro-ring resonator;
    joining a first buffer layer with the silicon micro-ring resonator, wherein the first buffer layer is formed of a III-V group semiconductor material doped with a first type of carrier;
    attaching a quantum well to the first buffer layer, with the quantum well being optically coupled to the silicon micro-ring resonator;
    connecting a second buffer layer to the quantum well, wherein the second buffer layer is formed of III-V group semiconductor material doped with a second type of carrier having a charge opposite the first type of carrier and the second buffer layer forms a ring and has a cross section with a substantially triangular shape or a substantially trapezoidal shape, wherein a trapezoidal shaped cross section comprises a quadrilateral with two parallel sides and two non-parallel sides, the second buffer having a wide area coupled to the quantum well and a narrow area;
    joining a ring electrode to the narrow area of the second buffer layer to form a continuous junction between the ring formed by the second buffer layer and the ring electrode; and
    including a center electrode near a center of the silicon micro-ring resonator to enable carriers to be injected into the quantum well between the center electrode and the ring electrode to provide amplification of the light of the selected wavelength;

wherein an imaginary cylinder has a center positioned at the center of the silicon micro-ring resonator and the imaginary cylinder has a radius defined by an innermost edge of the silicon micro-ring resonator, wherein the center electrode is confined within the imaginary cylinder.

8. A method as in claim 7, further comprising forming the shape of the second buffer layer by etching a plurality of levels, with each increasing level having a decreasing length.

9. A method as in claim 7, further comprising forming the shape of the second buffer layer shaped with a narrowed top portion to direct a single fundamental TE-mode such that the maximum amount of electromagnetic energy in the single fundamental TE-mode is located within the quantum well to provide increased gain of the light within the quantum well.

10. A method as in claim 7, further comprising positioning an optical waveguide sufficiently close to the silicon micro-ring resonator to enable the light within the silicon micro-ring resonator to evanescently couple to the optical waveguide to enable laser light to be directed from the silicon micro-ring resonator.

11. An electrically pumped hybrid III-V group and silicon laser system, comprising:
- a silicon micro-ring resonator;
- a quantum well formed of a III-V group semiconductor material that is optically coupled with the silicon micro-ring resonator to provide optical gain;
- a first buffer formed of a III-V group semiconductor material doped with a first type of carrier, wherein the first buffer is coupled to the quantum well, wherein the first buffer forms a ring with a cross section that is substantially triangular shaped or substantially trapezoidal shaped, wherein a trapezoidal shaped cross section comprises a quadrilateral with two parallel sides and two non-parallel sides;
- a second buffer formed of a III-V group semiconductor material doped with a second type of carrier, wherein the second buffer is located between the quantum well and the silicon micro-ring resonator;
- a center electrode located at a center of the silicon micro-ring resonator and contacting the second buffer, wherein the second buffer enables the center electrode to be substantially isolated from an optical mode of the micro-ring resonator;
- wherein an imaginary cylinder has a center positioned at the center of the silicon micro-ring resonator and the imaginary cylinder has a radius defined by an innermost edge of the silicon micro-ring resonator, wherein the center electrode is confined within the imaginary cylinder.

12. The system of claim 11, further comprising an outer electrode coupled to the first buffer and located a selected distance from the micro-ring resonator.

13. The system of claim 11, further comprising an optical waveguide located sufficiently close to the silicon micro-ring resonator to enable laser light from the micro-ring resonator to couple evanescently to the optical waveguide.

* * * * *